(12) United States Patent
Chatterjee et al.

(10) Patent No.: US 9,257,330 B2
(45) Date of Patent: Feb. 9, 2016

(54) ULTRA-THIN STRUCTURE TO PROTECT COPPER AND METHOD OF PREPARATION

(71) Applicant: Applied Materials, Inc., Santa Clara, CA (US)

(72) Inventors: Amit Chatterjee, Cupertino, CA (US); Geetika Bajaj, New Delhi (IN); Pramit Manna, Santa Clara, CA (US); He Ren, San Jose, CA (US); Tapash Chakraborty, Mumbai (IN); Srinivas D. Nemani, Sunnyvale, CA (US); Mehul Naik, San Jose, CA (US); Robert Jan visser, Menlo Park, CA (US); Abhijit Basu Mallick, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/483,578

(22) Filed: Sep. 11, 2014

(65) Prior Publication Data

US 2015/0147879 A1  May 28, 2015

Related U.S. Application Data

(60) Provisional application No. 61/909,970, filed on Nov. 27, 2013.

(51) Int. Cl.
*H01L 21/68* (2006.01)
*H01L 21/768* (2006.01)
*H01L 23/532* (2006.01)

(52) U.S. Cl.
CPC .... *H01L 21/76834* (2013.01); *H01L 21/76832* (2013.01); *H01L 21/76835* (2013.01); *H01L 21/76838* (2013.01); *H01L 23/53238* (2013.01); *H01L 23/53295* (2013.01)

(58) Field of Classification Search
CPC .............. H01L 21/76832; H01L 21/76835; H01L 21/76838; H01L 21/53238; H01L 21/53295; H01L 21/76834; H01L 23/53238; H01L 23/53295
USPC ............. 438/653, 654, 622, 624, 627, 672
See application file for complete search history.

(56) References Cited

U.S. PATENT DOCUMENTS

| | | | |
|---|---|---|---|
| 5,620,850 A * | 4/1997 | Bamdad et al. | 530/300 |
| 7,205,663 B2 * | 4/2007 | Gracias | 257/753 |
| 7,326,526 B2 * | 2/2008 | McGimpsey et al. | 430/345 |
| 7,994,640 B1 * | 8/2011 | Alers et al. | 257/767 |
| 2005/0186339 A1 | 8/2005 | Rajagopalan et al. | |
| 2010/0249375 A1 * | 9/2010 | Martin et al. | 530/345 |
| 2011/0163062 A1 * | 7/2011 | Gordon et al. | 216/13 |
| 2014/0183737 A1 * | 7/2014 | Zhang et al. | 257/751 |
| 2014/0231998 A1 * | 8/2014 | Kuo et al. | 257/751 |

* cited by examiner

*Primary Examiner* — Michael Trinh
(74) *Attorney, Agent, or Firm* — Kilpatrick Townsend & Stockton LLP

(57) ABSTRACT

Methods of depositing thin, low dielectric constant layers that are effective diffusion barriers on metal interconnects of semiconductor circuits are described. A self-assembled monolayer (SAM) of molecules each having a head moiety and a tail moiety are deposited on the metal. The SAM molecules self-align, wherein the head moiety is formulated to selectively bond to the metal layer leaving the tail moiety disposed at a distal end of the molecule. A dielectric layer is subsequently deposited on the SAM, chemically bonding to the tail moiety of the SAM molecules.

20 Claims, 6 Drawing Sheets

ULTRA-THIN STRUCTURE TO PROTECT COPPER AND METHOD OF PREPARATION

CROSS-REFERENCES TO RELATED APPLICATIONS

This application claims the benefit of of U.S. Provisional Application No. 61/909,970, filed Nov. 27, 2013, which is incorporated by reference herein in its entirety for all purposes.

BACKGROUND OF THE INVENTION

Embodiments of the present invention relate to methods of reducing the overall dielectric constant in dielectric layers disposed on metallic interconnect structures, such as those used on semiconductor devices.

Semiconductor device geometries have dramatically decreased in size since their introduction several decades ago. Modern semiconductor fabrication equipment is routinely used to produce devices having geometries as small as 28 nm and less, and new equipment designs are continually being developed and implemented to produce devices with even smaller geometries. As device geometries decrease, the impact of interconnect resistance and capacitance on device performance becomes more profound, limiting the performance of the device. To address these needs, metals such as aluminum and copper have been used for interconnects to decrease resistance, while the thickness of the dielectric layers surrounding the interconnects have been minimized to reduce capacitance. However, as the dielectric layer is thinned, its performance as a diffusion barrier to the underlying metal is diminished, resulting in decreased reliability of the device.

BRIEF SUMMARY OF THE INVENTION

Methods of depositing thin, low dielectric constant layers that are effective diffusion barriers on metal interconnects are described. In one embodiment, a self-assembled monolayer (SAM) of molecules each having a head moiety and a tail moiety are deposited on the metal. The SAM molecules self-align, wherein the head moiety is formulated to selectively bond to the metal layer leaving the tail moiety disposed at a distal end of the molecule. A dielectric layer is subsequently deposited on the SAM, chemically bonding to the tail moiety of the SAM molecules.

In one embodiment a method of forming a diffusion barrier on a metal layer disposed on a semiconductor substrate is described. The method includes depositing a first monolayer of molecules in a self-limiting reaction on the metal layer, where each molecule of the first monolayer of molecules has a head moiety that has an affinity for the metal layer and a tail moiety that has an affinity for a dielectric layer.

In another embodiment a method of forming a metal interconnect structure on a substrate is described. The method includes depositing the metal layer then depositing a monolayer of molecules on the metal layer. Each molecule of the monolayer of molecules includes a head moiety and a tail moiety such that the head moiety is configured to form a bond with the metal layer and the tail moiety is configured to form a bond with a first dielectric layer. A first dielectric layer is deposited on the monolayer of molecules.

To better understand the nature and advantages of the present invention, reference should be made to the following description and the accompanying figures. It is to be understood, however, that each of the figures is provided for the purpose of illustration only and is not intended as a definition of the limits of the scope of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Certain embodiments of the present invention relate to a method that is useful for the fabrication of thin, low dielectric constant diffusion barrier layers on metal. While the present invention can be useful to produce a wide variety of such dielectric layers on metal, some embodiments of the invention are particularly useful for producing them on metallic semiconductor device interconnects, as described in more detail below. It is understood, however, that such a process may also be employed to provide a thin, low dielectric constant diffusion barriers on any metal surface.

Figure 1A:
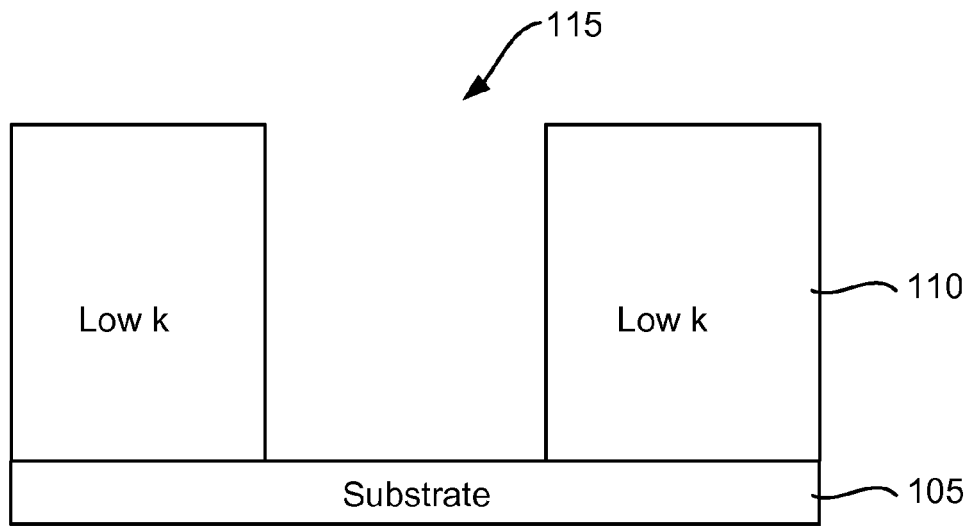
FIG. 1A is a cross-sectional diagram of a low-k layer on a substrate according to some embodiments.
Figure 1B:
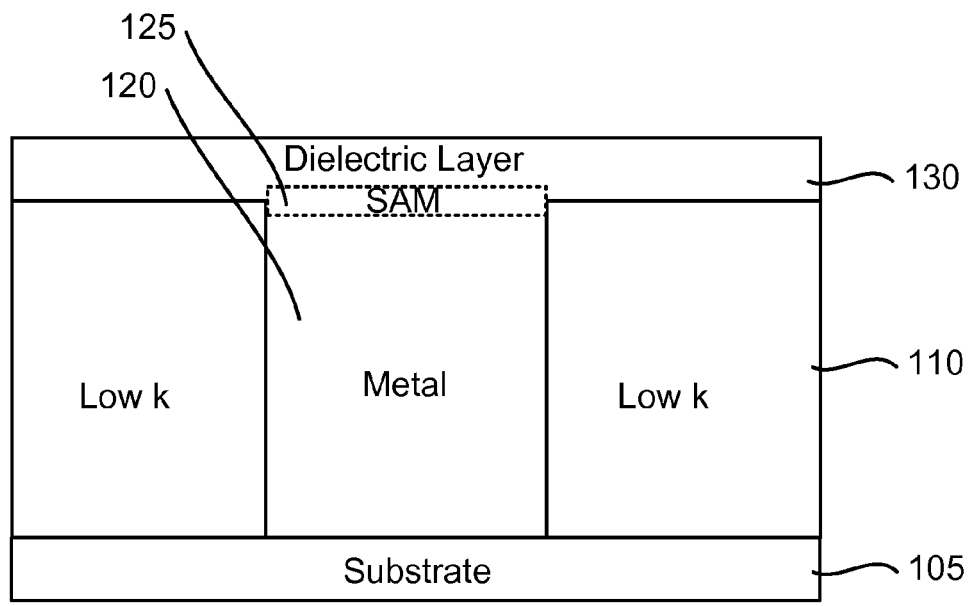
FIG. 1B is cross-sectional diagram of a metal having a SAM and a dielectric layer formed on it according to some embodiments.

Methods of depositing a self-assembled monolayer (SAM) on a metal and applying a dielectric layer over the SAM are described. As illustrated in FIGS. 1A-1B, in some embodiments, a damascene process may be used to form a semiconductor interconnect. An underlying substrate layer 105 has a layer of low dielectric constant (low-k) film 110. A suitable low-k film 110 is Black Diamond™, which is available from Applied Materials, Santa Clara, Calif. The Black Diamond™ film is an organo-silane film with a lower dielectric constant (e.g., about 3.5 or less) than conventional spacer materials like silicon oxides and nitrides. Other low-k films may be used and are within the scope of this disclosure. Low-k film 110 is patterned with a selective etch to form trench 115. As illustrated in FIG. 1B, a metal 120, such as copper, may be disposed in trench 115. A SAM 125 comprising molecules having a head moiety and a tail moiety may be disposed on metal 120, and in some embodiments on low-k film 110, as described in more detail below. FIGS. 1A and 1B are for illustration only and the actual thickness of SAM 125 is relatively much smaller than shown. A dielectric film 130 such as, for example, SiO, SiN or SiCN may be deposited over low-k film 110 and SAM 125.

Figure 2:
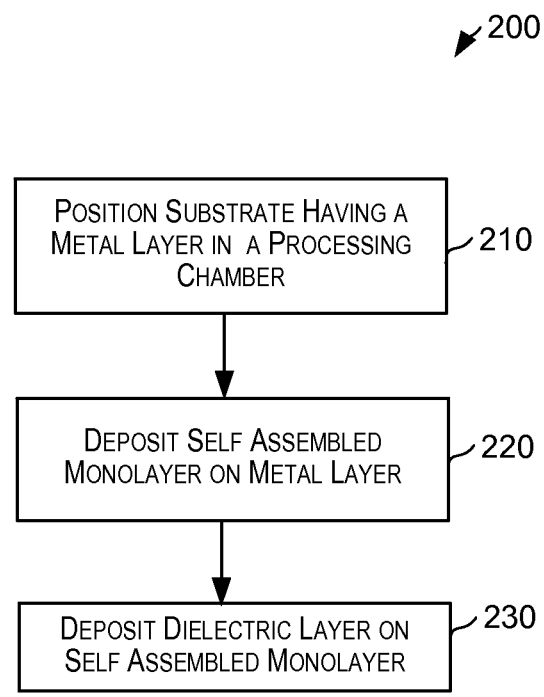
FIG. 2 is method of depositing a SAM and a dielectric layer on a metal interconnect according to some embodiments.

Reference is now made to FIGS. 2 and 3A-3D, regarding the operations associated with the manufacture and processing of a thin, low dielectric constant diffusion barrier layer on a metal interconnect. FIG. 2 is a flow chart that illustrates the general steps associated with the manufacture and assembly of a thin, low dielectric constant diffusion barrier layer on a metal interconnect according to one embodiment of the invention. FIGS. 3A-3D depict a metal layer on which is formed a thin, low dielectric constant diffusion barrier layer in accordance with the various stages of manufacture set forth in FIG. 2.

Figure 3A:
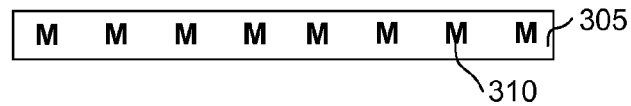
FIGS. 3A-3D are graphical illustrations of the deposition of a SAM and a dielectric layer on a metal interconnect according to some embodiments.

Now referring to FIGS. 3A-3D, the manufacture of a thin, low dielectric constant diffusion barrier layer on a metal may be initiated. In operation 210, a substrate having a metal layer may be placed in a processing chamber. FIG. 3A illustrates a metal layer 305 having a plurality of atomic bonding sites 310 disposed on an outer surface of the metal layer. Each atomic bonding site 310 is designated with an "M" which represents a location where molecules may form chemical bonds with metal atoms disposed on the outer surface of metal layer 305. In some embodiments metal layer 305 may, for example, comprise copper or aluminum. In other embodiments other elemental metals or alloys may be used.

Figure 3B:
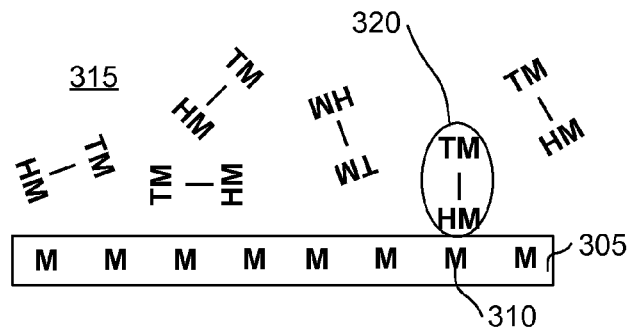

In operation 220 (see FIG. 2) a SAM is deposited on metal layer 305. A SAM is essentially a layer of molecules formed spontaneously on surfaces by adsorption. Each SAM molecule 315 may comprise a head moiety "HM" at a first end of the molecule and a tail moiety "TM" at a distal end of the molecule. These head and tail moieties or "functional groups" may be connected by an intermediate portion referred to as chain. In some embodiments, the chain may comprise linear or aromatic hydrocarbons. SAMs are created by the chemisorption of "head functional groups" onto a substrate from either the vapor or liquid phase followed by a slow organization of "tail functional groups". FIG. 3B illustrates a plurality of SAM molecules 315 during a deposition process where the SAM molecules are randomly oriented and proximate metal layer 305. In some embodiments SAM molecule 315 may be organic.

In further embodiments the head moiety of SAM molecule 315 may be specifically selected and formulated to bind with the particular metal in metal layer 305. In still further embodiments the tail moiety may be selected and formulated to bind with a particular dielectric that may be subsequently deposited on the SAM, as discussed in more detail below. Thus, in some embodiments SAM molecules 315 may self-align, wherein the head moiety may selectively bond to the particular metal employed in metal layer 305 and the tail moiety may not bond to metal layer 305.

For example, in some embodiments where copper is the metal and SiCN is the dielectric, the head moiety of the molecule may contain a sulfur-containing group (e.g. thiol group) or a nitrogen containing group (e.g., amine group) which have an affinity for bonding with copper. In further embodiments, the tail moiety may include a functional group such as an alkoxy group (e.g., alkoxysilane) that has an affinity for a dielectric material, and not for copper. In these embodiments plurality of molecules 315 may self-align wherein only the head moiety may bond with metal layer 305. FIG. 3B further illustrates a bonded SAM molecule 320 that has a head moiety "HM" chemically bonded to metal atom bonding site 310 "M" of metal layer 305. The local chemical interaction between metal atom bonding site 310 and head moiety of bonded molecule 320 may immobilize the metal and inhibit metal ionization and diffusion. Once all metal atom bonding sites 310 in metal layer 305 are bonded with SAM molecules 315, the bonding process may cease, becoming a self-limiting process.

Figure 3C:
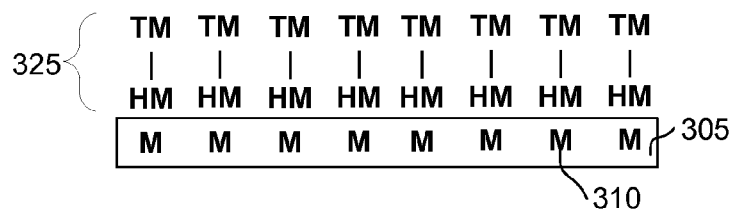
Figure 3D:
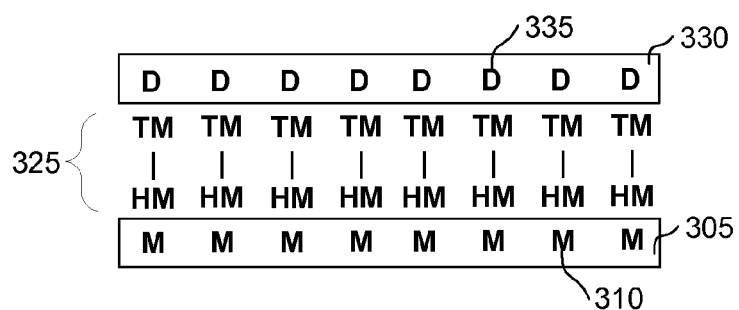

FIG. 3C illustrates a completed SAM 325, which is a layer of an aligned molecules chemically bonded to metal layer 305. In operation 230 (see FIG. 2) a dielectric layer is deposited on SAM 325. FIG. 3D illustrates a dielectric layer 330 disposed on SAM 325. Dielectric layer 330 has a plurality of dielectric bonding sites 335 illustrated as "D" that may chemically bond with the tail moiety of SAM 325 molecules. In some embodiments, dielectric layer 330 may comprise, for example, SiO, SiC, SiN or SiCN.

In further embodiments, the thickness of SAM 325 is approximately less than 5 nanometers. In other embodiments the thickness of SAM 325 is approximately less than 2 nanometers. In one embodiment SAM 325 is thermally stable and can withstand dielectric layer 330 deposition at high temperatures and other subsequent processing. In further embodiments, SAM 325 can also serve as adhesion layer between metal layer 305 and dielectric layer 330. The impact of SAM 325 on metal diffusion may be further improved by selecting SAMs of suitable chain lengths. In some embodiments, SAMs 315 having longer chain analogues of organic molecules may inhibit diffusion better than SAMs with shorter chains, assuming similar head and tail moieties.

It will be appreciated that the deposition and formulation of thin, low dielectric constant diffusion barrier layers on a metal described herein is illustrative and that variations and modifications are possible. For instance, the SAM concept extends to multi-layered copper diffusion barriers. In some embodiments, by selecting appropriate molecule and reaction conditions, bilayer SAMs can be formed which also can serve as diffusion barrier.

In another embodiment, a layer of $Si_3N_4$ can be subsequently deposited on the SAM and the combination of a SAM and $Si_3N_4$ together can be used as diffusion barrier. In some embodiments this combination may enhance the thermal stability and barrier properties of a SAM. In further embodiments the tail moiety of the molecules within the SAM may be formulated to selectively bond to the $Si_3N_4$.

In another embodiment, one SAM molecule can be grafted on top of another SAM molecule resulting in a multilayer configuration. The composition of the layers may be tailored to provide additional functionality to the metal diffusion barrier film and this technique can be used to further tailor the barrier length. In other embodiments, more than two layers may be used. In some embodiments, a layer of layer of $Si_3N_4$ can be subsequently deposited on the final SAM.

In other embodiments, chelating agents may be employed. A chelate is a chemical compound in the form of a heterocyclic ring, containing a metal ion attached by coordinate bonds to at least two nonmetal ions. Chelating agents are known to react with metals and form metal complexes. In some embodiments, a chelating agent may be deposited on the surface of the metal layer whereby formation of metal complexes may immobilize the metal atoms, thereby slowing or preventing metal diffusion. The chelating moiety can be specifically designed to provide these ultra-thin layers enhanced stability and improved performance. In some embodiments a subsequent SAM may be employed on top of the metal complexes while in other embodiments only the chelating agent may be employed. In one embodiment, a subsequent SAM is deposited on a chelated layer wherein the head moiety of the SAM is specifically formulated to bond with the metal complex. In other embodiments the head moiety may be specifically formulated to bond with the metal. In further embodiments a SAM may be first deposited on the metal layer and a chelating agent may be deposited on the SAM. In this embodiment there may be no metal atoms available for the chelating agent to react with. Thus, the chelating agent may act as an atomic trap, whereby if metal atoms diffuse through the SAM, the chelating agent will react with them and arrest their further diffusion. In further embodiments, combinations layers of chelating agent, SAM and $Si_3N_4$ may be used. In one embodiment, for example, the configuration may be chelating agent/SAM/$Si_3N_4$ while in other embodiments it may be SAM/$Si_3N_4$/chelating agent.

In another embodiment the head or tail moiety of the SAM molecules may contain oxygen containing groups such as OH or COOH and in further embodiments may contain functional groups containing NH2 or CONH2. Other chemical compositions of the head and tail groups are within the scope of the invention.

In another embodiments where metal layer 305 is adjacent to a low-k dielectric layer (such as 110 in FIG. 1) the SAM may simultaneously deposit on the low-k layer as well as the metal layer. In such embodiments SAM may invert such that the tail moiety, configured to have an affinity for a dielectric, may attach to low-k dielectric 110.

Figure 4:
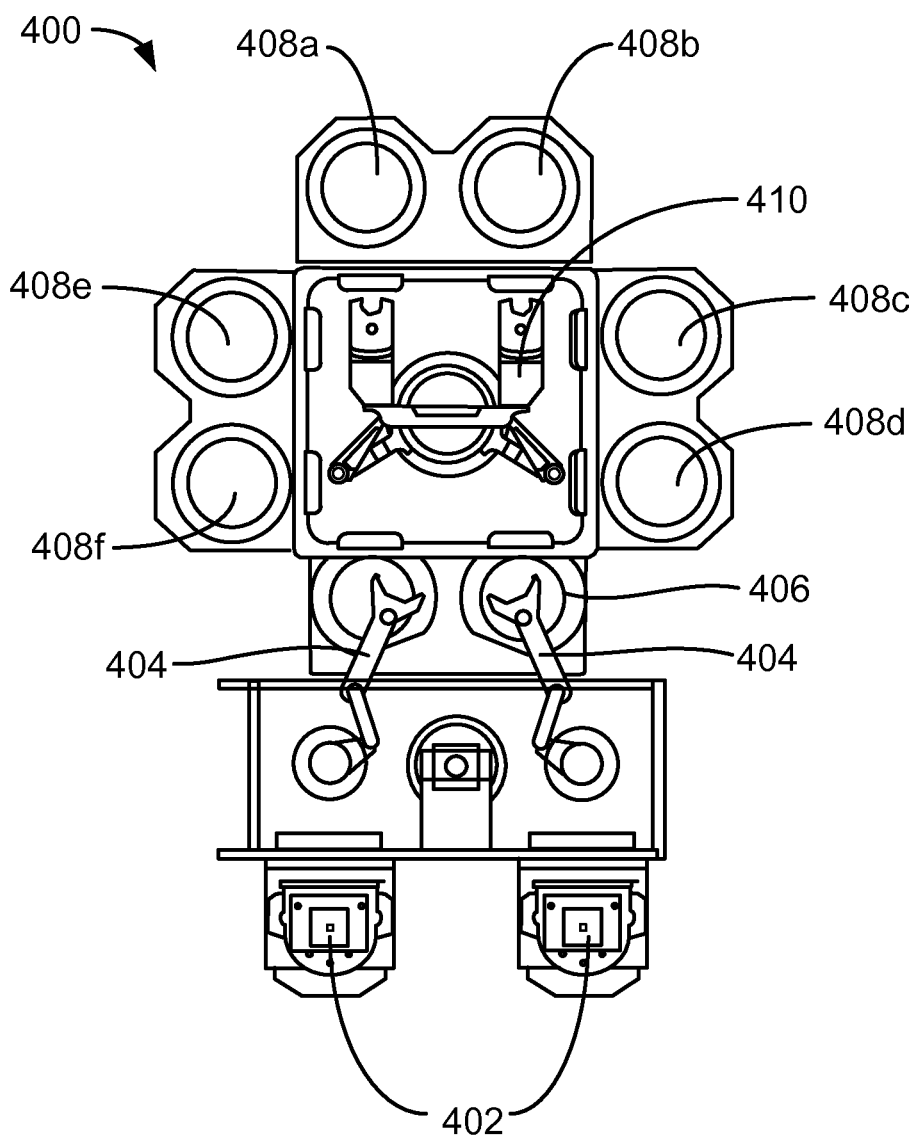
FIG. 4 is a schematic top-view diagram of an exemplary multi-chamber substrate processing system which can be used to carry out processes according to some embodiments.
Figure 5:
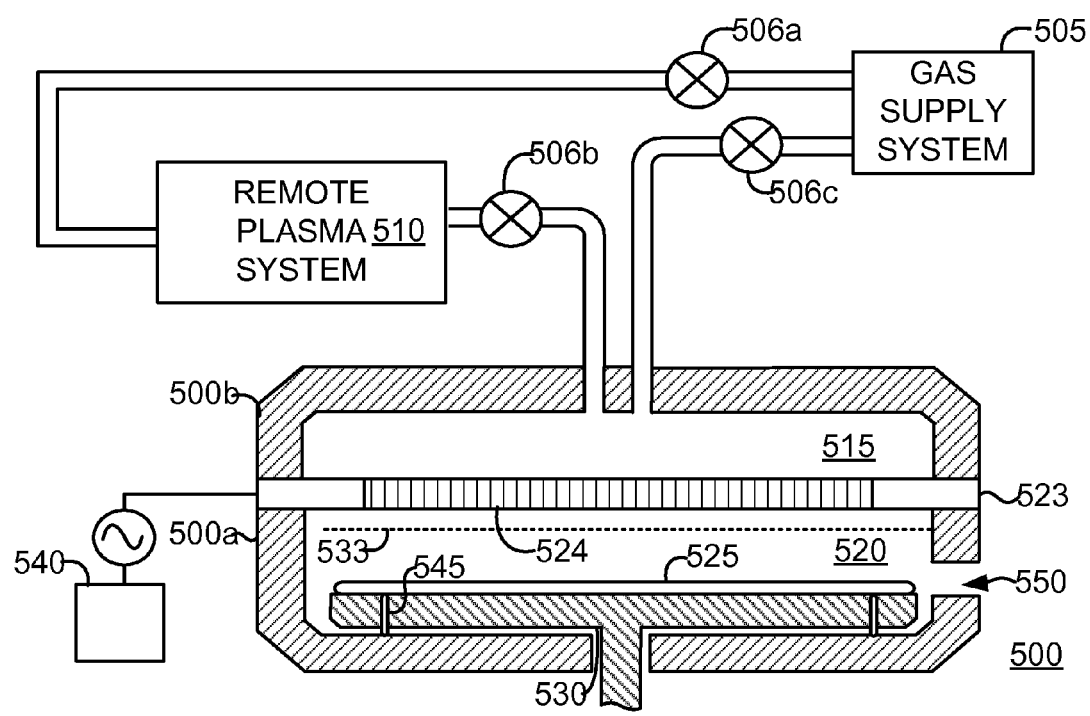
FIG. 5 is a cross-sectional diagram of an exemplary deposition chamber which can be used to carry out processes according to some embodiments.

Myriad methods, processes and equipment may be used to deposit a SAM. In some embodiments the same deposition tool that is used to deposit the subsequent dielectric layer may be used to deposit the SAM. Embodiments of the deposition systems may be incorporated into larger fabrication systems for producing integrated circuit chips. FIG. 4 shows one such system 400 of deposition, baking and curing chambers according to disclosed embodiments. FIG. 5 illustrates a vertical cross-sectional view of a PECVD chamber 500 that may be used in one embodiment.

Example Deposition System

Deposition chambers that may implement embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples of CVD systems that may implement embodiments of the invention include the CENTURA ULTIMA® HDP-CVD chambers/systems, and PRODUCER® PECVD chambers/systems, available from Applied Materials, Inc. of Santa Clara, Calif.

Examples of substrate processing chambers that can be used with exemplary methods of the invention may include those shown and described in co-assigned U.S. Patent Publication No. 2007/0289534 to Lubomirsky et al, titled "PROCESS CHAMBER FOR DIELECTRIC GAPFILL," the entire contents of which is herein incorporated by reference for all purposes. Additional exemplary systems may include those shown and described in U.S. Pat. Nos. 6,387,207 and 6,830,624, which are also incorporated herein by reference for all purposes.

Embodiments of the deposition systems may be incorporated into larger fabrication systems for producing integrated circuit chips. FIG. 4 shows one such system 400 of deposition, baking and curing chambers according to disclosed embodiments. In the figure, a pair of FOUPs (front opening unified pods) 402 supply substrate substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectic. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. Any one or more of the processes described may be carried out on chamber(s) separated from the fabrication system shown in different embodiments.

In addition, one or more of the process chambers 408a-f may be configured as a wet treatment chamber. These process chambers include heating the flowable dielectric film in an atmosphere that include moisture. Thus, embodiments of system 400 may include wet treatment chambers 408a-b and anneal processing chambers 408c-d to perform both wet and dry anneals on the deposited dielectric film.

Referring now to FIG. 5, a vertical cross-sectional view of a PECVD chamber 500 is shown and includes a chamber body 500a and a chamber lid 500b. PECVD chamber 500 contains a gas supply system 505 which may provide several precursor through chamber lid 500b into upper chamber region 515. The precursors disperse within upper chamber region 515 and are evenly introduced into substrate processing region 520 through blocker plate assembly 523. During substrate processing, substrate processing region 520 houses substrate 525 which has been transferred onto substrate support pedestal 530. Support pedestal 530 may provide heat to substrate 525 during processing to facilitate a deposition reaction.

The bottom surface of blocker plate assembly 523 may be formed from an electrically conducting material in order to serve as an electrode for forming a capacitive plasma. During processing, the substrate (e.g. a semiconductor wafer) is positioned on a flat (or slightly convex) surface of the pedestal 530. Substrate support pedestal 530 can be moved controllably between a lower loading/off-loading position (depicted in FIG. 5) and an upper processing position (indicated by dashed line 533). The separation between the dashed line and the bottom surface of blocker plate assembly 523 is a parameter which helps control the plasma power density during processing.

Before entering upper chamber region 515, deposition and carrier gases are flowed from gas supply system 505 through combined or separated delivery lines. Generally, the supply line for each process gas includes (i) several safety shut-off valves 506 that can be used to automatically or manually shut-off the flow of process gas into the chamber, and (ii) mass flow controllers (not shown) that measure the flow of gas through the supply line. Some gases may flow through a remote plasma system (RPS) 510 prior to entry into upper chamber region 515.

Once inside upper chamber region 515, deposition and carrier gases are introduced into substrate processing region 500 through holes in perforated circular gas distribution faceplate 524 which forms the lower portion of blocker plate assembly 523. Blocker plate assembly 523 may also include a perforated blocker plate in order to increase the evenness of the distribution of precursors into substrate processing region 520.

The deposition process performed in the CVD chamber 500 can be either a thermal process or a plasma-enhanced process. In a plasma-enhanced process, an RF power supply 540 applies electrical power between gas distribution faceplate 524 and support pedestal 530 to excite the process gas mixture to form a plasma within the cylindrical region between gas distribution faceplate 524 and substrate 525 supported by pedestal 530. Gas distribution faceplate 524 has either a conducting surface or is insulating with a metal insert. Regardless of position, the metal portion of gas distribution faceplate 524 is electrically isolated from the rest of CVD chamber 500 via dielectric inserts which allow the voltage of faceplate 524 to be varied with respect to, especially, support pedestal 530.

Flowing precursors into upper chamber region 515 and subsequently into substrate processing region 520 in conjunction with applying RF power between faceplate 524 and support pedestal 530 creates a plasma between faceplate 524 and substrate 525. The plasma produces plasma effluents which react to deposit a desired film on the surface of the semiconductor wafer supported on pedestal 530. RF power supply 540 may be a mixed frequency RF power supply that typically supplies power at a high RF frequency (RF1) of 13.56 MHz and a low RF frequency (RF2) of 360 KHz to enhance the decomposition of reactive species introduced into substrate processing region 520. In a thermal process, RF power supply 540 would not be utilized, and the process gas mixture thermally reacts to deposit the desired films on the surface of the semiconductor wafer supported on support pedestal 530. Support pedestal 530 may be resistively heated to provide thermal energy to assist with the reaction.

During a plasma-enhanced deposition process, the plasma heats up process chamber 500, including the walls of the chamber body 500a surrounding an exhaust passageway (not shown) used to exhaust gases from the chamber 500. When the plasma is not turned on or during a thermal deposition process, a hot fluid may be circulated through the walls of the process chamber 500 to maintain the chamber at an elevated temperature. Channels (not shown) may be provided within the chamber walls of CVD chamber 500 for the hot fluid flow. Fluids used to heat the chamber body 500a and possibly chamber lid 500b may include water-based ethylene glycol, oil-based thermal transfer fluids and the like. Chamber heating can reduce condensation of reactant products which otherwise might migrate back into the processing chamber and adversely affect the current or a subsequent deposition.

The remainder of the gas mixture that is not deposited in a layer, including reaction byproducts, is evacuated from the CVD chamber 500 by a vacuum pump through an orifice (not shown) in chamber body 500a.

The wafer support platter of support pedestal 530 (preferably aluminum, anodized aluminum, ceramic, or a combination thereof) is resistively heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of support pedestal 500.

Typically, any or all of the chamber lining, gas inlet manifold faceplate, and various other reactor hardware are made out of material such as aluminum, anodized aluminum, or ceramic. An example of such a CVD apparatus is described in co-assigned U.S. Pat. No. 5,558,717 entitled "CVD Processing Chamber," issued to Zhao et al, and hereby incorporated by reference in its entirety.

A lift mechanism and motor raises and lowers the support pedestal 530 and its wafer lift pins 545 as wafers are transferred into and out of substrate processing region 520 by a robot blade (not shown) through an insertion/removal opening 550 in the side of chamber body 500a. The motor raises and lowers support pedestal 530 between a processing position 533 and a lower, wafer-loading position.

Remote plasma system 510 may be mounted on chamber lid 500b of CVD chamber 500. In this case, remote plasma system 510 is desirably a compact, self-contained unit that can be conveniently mounted on chamber lid 500b and be easily retrofitted onto existing chambers without costly and time-consuming modifications. One suitable unit is the ASTRON® generator available from Applied Science and Technology, Inc. of Woburn, Mass. The ASTRON® generator utilizes a low-field toroidal plasma to dissociate a process gas. In one example, the plasma dissociates a process gas including a fluorine-containing gas such as $NF_3$ and a carrier gas such as argon to generate free fluorine which is used to clean film deposits in CVD chamber 500.

The substrate processing system is controlled by a system controller. In an exemplary embodiment, the system controller includes storage media and processors (e.g. general purpose microprocessors or application specific IC's). The processors may be processor cores present on a monolithic integrated circuit, separated but still located on a single-board computer (SBC) or located on separate printed circuit cards possibly located at different locations about the substrate processing system. The processors communicate with one another as well as with analog and digital input/output boards, interface boards and stepper motor controller boards using standard communication protocols.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber and substrate temperatures, RF power levels, support pedestal position, and other parameters of a particular process.

A process for depositing a varyingly-doped film stack on a substrate can be implemented using a computer program product that is executed by the system controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. A layer of "silicon germanium", "silicon" or "germanium" may include minority concentrations of other elemental constituents such as nitrogen, hydrogen, carbon and the like. A gas in an "excited state" describes a gas wherein at least some of the gas molecules are in vibrationally-excited, dissociated and/or ionized states. A gas may be a combination of two or more gases. The term "column" is used throughout with no implication that the formed geometry is circular. Viewed from above the surface, columns may appear circular, oval, polygonal, rectangular, or a variety of other shapes. The term "precursor" is used to refer to any process gas which takes part in a reaction to either remove or deposit material from a surface.

Experimental Results of Samples with and without SAM

Figure 6:
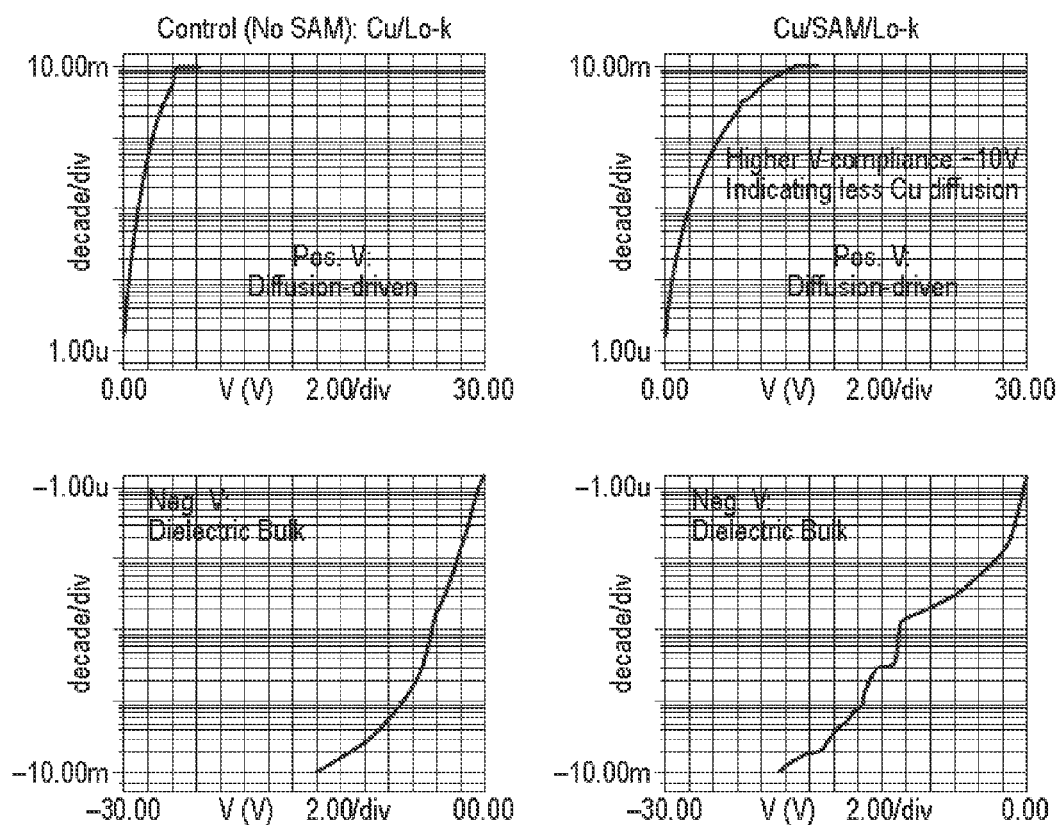
FIG. 6 illustrates the results of electrical stress testing of samples according to some embodiments.

To evaluate the barrier properties of the SAM, a low-k dielectric layer of thickness of 200 nm was deposited on wafers having Cu-MPTMS SAM. The electrical stress testing of the Cu-MPTMS SAM-low stack and a control without SAM (only Cu-low k) was performed. FIG. 6 illustrates test results of the samples.

SAMs of (3-mercaptopropyl)trimethoxysilane (MPTMS) were deposited in both liquid phase as well as vapor phase on wafers having copper layers. The wafers with SAMs are referred as Cu-MPTMS SAM. The SAM formation was confirmed from XPS data. The characteristic binding energy of S2p indicated that MPTMS molecule was bound to copper through the —SH terminal. The wafers having Cu-MPTMS SAM-low k showed good adhesion or mechanical properties when tested using a conventional Scotch tape test.

As illustrated in FIG. 6, the Cu-MPTMS SAM-low k stack showed higher compliance voltage as well as lower leakage for positive stressing. Also, for negative stressing, the Cu-MPTMS SAM-low k stack showed higher compliance voltage, indicating SAM layer may be used as effective barrier. The breakdown voltage measurement for the Cu-low k stacks and Cu-MPTMS SAM-low k stacks were also performed using mercury probe CV measurements. The results showed an increase in the breakdown voltage value in the Cu-MPTMS SAM-low k samples indicating improved performance.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of forming a diffusion barrier on a metal layer disposed on a semiconductor substrate, the method comprising:
   depositing a first monolayer of molecules in a self-limiting reaction on the metal layer, each molecule of the first monolayer of molecules having a first head moiety having an affinity for the metal layer and a first tail moiety having an affinity for one or more dielectric materials;
   depositing a second monolayer of molecules on top of the first monolayer, each molecule of the second monolayer having a second head moiety and a second tail moiety, wherein first tail moieties of at least some molecules of the first monolayer bond with second head moieties of at least some molecules of the second monolayer, and wherein the second tail moiety has an affinity for one or more dielectric materials; and
   depositing a dielectric layer on top of the second monolayer to form a bond between second tail moieties of at least some molecules of the second monolayer and the dielectric layer.

2. The method of claim 1, wherein a layer of $Si_3N_4$ is deposited on the second monolayer of molecules before depositing the dielectric layer.

3. The method of claim 1, wherein the dielectric layer comprises SiCN.

4. The method of claim 1, wherein a chelating agent is applied to the metal layer forming a metal complex before depositing the first monolayer of molecules.

5. The method of claim 1, wherein the first head moiety includes a thiol group.

6. The method of claim 1, wherein the first head moiety includes an amine group.

7. The method of claim 1, wherein the first head moiety includes an alkoxy group.

8. The method of claim 1 wherein the thickness of the first monolayer of molecules is less than 5 nanometers.

9. A method of forming a metal diffusion barrier, the method comprising:
   depositing a metal layer on a substrate;
   depositing a first monolayer of molecules on the metal layer wherein each molecule of the first monolayer of molecules includes a head moiety and a tail moiety, the head moiety forming a bond with the metal layer and the tail moiety configured to form a bond with one or more dielectric materials;

depositing a first chelating agent on top of the first monolayer of molecules such that the chelating agent is unbound to metal atoms; and depositing a dielectric layer on the first monolayer of molecules and the chelating agent.

10. The method of claim 9 wherein the dielectric layer comprises SiCN.

11. The method of claim 9 wherein the metal layer comprises copper.

12. The method of claim 9 wherein a second monolayer of molecules is deposited on the first monolayer of molecules before depositing the dielectric layer.

13. The method of claim 12, wherein each molecule of the second monolayer of molecules includes a second head moiety and a second tail moiety, at least some of the second head moieties forming a bond with the first monolayer of molecules and the second tail moiety configured to form a bond with the dielectric layer.

14. The method of claim 9 wherein a layer of $Si_3N_4$ is deposited on the first monolayer of molecules before depositing the dielectric layer.

15. The method of claim 9, wherein a second chelating agent is applied to the metal layer forming a metal complex before depositing the first monolayer of molecules.

16. The method of claim 9, wherein the chelating agent is configured to bond with atoms diffusing from the metal layer.

17. The method of claim 9, wherein a second chelating agent is applied to the metal layer before depositing the first monolayer of molecules and $Si_3N_4$ is deposited on the first monolayer of molecules before depositing the dielectric layer.

18. A metal interconnect structure on a substrate, comprising:

a first dielectric layer disposed on the substrate;

a metal interconnect disposed within the first dielectric layer;

a first monolayer of molecules disposed on the metal interconnect, wherein each molecule of the first monolayer of molecules includes a first head moiety and a first tail moiety, the first head moiety forming a chemical bond with the metal interconnect;

a second monolayer of molecules disposed on the first monolayer, wherein each molecule of the second monolayer includes a second head moiety and a second tail moiety, the second head moiety forming a chemical bond with the first tail moiety; and a second dielectric layer disposed on the second monolayer, the second dielectric layer forming a chemical bond with the second tail moiety.

19. The metal interconnect structure of claim 18, wherein the first dielectric layer includes a low-k dielectric material.

20. The metal interconnect structure of claim 18, further comprising one or more additional monolayers of molecules between the metal interconnect and the second dielectric layer, wherein a total number of monolayers between the metal interconnect and the second dielectric layer and a thickness of each monolayer are determined based on a desired total thickness of the monolayers.

* * * * *